United States Patent [19]

Zogg

[11] 4,415,820

[45] Nov. 15, 1983

[54] TRANSISTOR DIFFERENTIAL CIRCUIT WITH EXPONENTIAL TRANSFER CHARACTERISTIC

[75] Inventor: Urs Zogg, Rümlang, Switzerland

[73] Assignee: Willi Studer, Fabrik fuer elektronische Apparate, Regensdorf, Switzerland

[21] Appl. No.: 237,105

[22] Filed: Feb. 23, 1981

[30] Foreign Application Priority Data

Mar. 19, 1980 [CH] Switzerland ........................ 2171/80

[51] Int. Cl.$^3$ ........................ H03K 5/08; H03K 17/00; H03K 3/26

[52] U.S. Cl. .................................... 307/491; 307/496; 307/288

[58] Field of Search ............... 307/291, 310, 313, 255, 307/292, 288, 494, 496, 490, 491; 328/127

[56] References Cited

U.S. PATENT DOCUMENTS

| | | | |
|---|---|---|---|
| 3,047,737 | 7/1962 | Kolodin | 307/292 |
| 3,345,583 | 10/1967 | Saunders | 307/292 |
| 3,737,682 | 6/1973 | Ahmed | 307/291 |

OTHER PUBLICATIONS

Wong & Ott, "Function Circuits", McGraw-Hill Book Co., 1976, pp. 46–49.

*Primary Examiner*—John S. Heyman
*Assistant Examiner*—Timothy P. Callahan
*Attorney, Agent, or Firm*—Frishauf, Holtz, Goodman & Woodward

[57] ABSTRACT

To provide for exactly exponential relationship between the collector current and the voltage applied between the bases of the differential circuit, two branches are provided, each containing a series connected circuit including transistors of respectively opposite conductivity type, and resistances positioned in each branch of such value that the sum of the voltage drops of connection and contact resistances arising in the respective branches are compensated. The values of the resistances are so selected that the voltage drop across the respective resistance matches the sum of the voltage drops due to the connection and contact resistances of the opposite branch.

8 Claims, 5 Drawing Figures

TRANSISTOR DIFFERENTIAL CIRCUIT WITH EXPONENTIAL TRANSFER CHARACTERISTIC

Reference to related patent publications:

U.S. Pat. No. 3,684,974—Solomon and Davis

U.S. Pat. No. 3,714,462—Blackmer

The present invention relates to a transistor differential circuit having exponential transfer relation, and more particularly to such a circuit in which the relationship between the collector current-ratio of the transistors and the base voltage-difference applied to the transistors has an exactly exponential relationship.

BACKGROUND

Differential stages are used in many applications of which a few representative ones are given.

For use in analog signal processing, see for example:

(1) Wong & Ott: Function Circuits, McGraw-Hill Book Co., 1976

(2) Blackmer, D. E.: Multiplier Circuits, U.S. Pat. No. 3,714,462

(3) Solomon & Davis: Automatic Gain Control Amplifier, U.S. Pat. No. 3,684,974

In analog computer technology, for example for logarithmic circuits, anti-log circuits, and multipliers—see:

(4) Wong & Ott: Function Circuits, McGraw-Hill Book Co., 1976.

In audio technology, e.g. for voltage controlled amplifiers—see:

(5) Blackmer, D. E.: Multiplier Circuits, U.S. Pat. No. 3,714,462.

(6) In high frequency technology with automatic gain control (AGC) circuits—see the aforementioned Solomon & Davis "Automatic Gain Control Amplifier", U.S. Pat. No. 3,684,974.

In voltage-controlled, voltage-current transfer circuits, in control technology, for integrators with voltage-controlled time constant; in filter technology, for filters with voltage-controlled limiting frequency, and in instrumentation, for function generators and sinusoidal oscillators with controlled frequency—see the above reference.

Ordinary differential circuits frequently do not have exact exponential relationship between control voltage to the base of the transistor circuit and the collector current; this, apparently, is due to the base connection resistances, and emitter contact and connection resistances. These connection resistances are also referred to as bulk resistances. The voltage drops over these resistances can be compensated—see the "Wong & Ott" reference above. This reference discloses that the error due to the voltage drop on the emitter and the base bulk resistances can be compensated by applying an equal and opposite voltage to the base of the transistor which generates the logarithmic function.

Compensating circuits as previously known have the disadvantage that the base connections of the transistors are used for compensation and thus cannot be connected to other circuits according to freely selectable design requirements. Compensation can be carried out with resistors only if a voltage proportional to the current through these resistors is available. The voltage, additionally, must be of the proper polarity. Junctions with a proportional voltage are loaded by the current flowing through the resistors.

The additional transistors are connected in parallel and thus cause twice the current which then must be connected through a current mirror circuit. Compensation at high frequency becomes inaccurate and is difficult to uses in integrated networks. The compensation error is additionally a function of temperature and is different in NPN and PNP differential circuits.

THE INVENTION

It is an object to provide a differential circuit utilizing transistors in which the relationship between base voltage difference and collector current ratio is accurately exponential and which, preferably, can be used over a wide range of frequencies and is essentially temperature independent.

Briefly, two branches are provided, each including a first transistor of a first conductivity type, for example an NPN, and, serially connected with the collector-emitter path thereof, a second transistor of the opposite conductivity type, that is, in the selected example a PNP transistor. Networks are provided which are connected to one of the transistors of each branch and which are dimensioned to control operation of the respective transistors to compensate for voltage drops of the connection or bulk resistances arising in the respective branches. Typically, the connections include resistors of low value which are, respectively, connected to the collectors and bases of the PNP transistors and additional resistors which interconnect the collector of one PNP transistor with the base of the other PNP transistor; in another form of the invention, low-resistance resistors are serially connected with the collectors of the PNP transistors and, further, the collectors of the PNP transistors in the respective branches are connected to the bases of the PNP transistors of the other branches, thereby effecting a cross connection.

The network thus leaves free the bases of the main transistors—in the example of the NPN transistors—which can be connected to any other circuit element since the base connections are not needed for compensation. No additional auxiliary voltages or auxiliary currents external to the differential stage are used.

Voltages proportional to the currents flowing through the connection and contact resistances are generated by the collectors of the series of connected transistors and additional resistors. If the entire circuit is placed on the integrated chip, the connection resistances are formed by connection track resistances on the chip. The series connected PNP transistors can be looked at as diodes for purposes of the user of the compensated differential stage, and generally do not cause additional power or heating losses in the overall circuit which are in excess of neglectable power losses. The compensation error as a function of temperature in the N-differential stage and the P-differential stage is the same if each branch in the differential stages has the same number of NPN and PNP transistors, which is the case in the circuit of the present invention. The compensation is accurate also at high frequency, since no phase shift due to current mirror circuits occurs. The differential stages can readily be integrated with processes with dielectric isolation.

Figure 1:
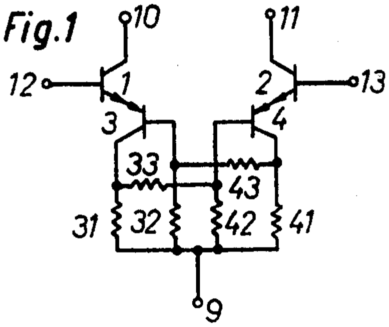
FIG. 1 is a schematic circuit diagram of a N-differential stage having two NPN transistors and PNP transistors, and six compensation resistors.

The N-differential stage of FIG. 1 has two NPN transistors 1, 2, and two PNP transistors 3, 4, and six compensating resistors 31, 32, 33 and 41, 42, 43. Resistors 31, 32 are the collector and base resistors, respectively, for a PNP transistor 3. Resistors 41, 42 are the collector and base resistors for a second PNP transistor 4. The resistor 33 is connected between the collector of one PNP transistor 3 in one branch of the circuit and the base of the other PNP transistor 4 in the other branch. Resistor 43 is connected between the collector of the second PNP transistor 4 and the base of the first PNP transistor 3. The four connecting resistors 31, 32, 41, 42 are connected together and at one terminal as a single junction 9, which forms the emitter of the N-differential stage of FIG. 1. The two connecting resistors 31, 41 have, for example, a value of 1 ohm each. The two resistors 32, 42 have, for example, a value of 100 ohms each. The importance circuit configuration in the example of FIG. 1 is, however, that the voltage drop across resistor 42, for example, is equal to the sum of the voltage drops of the connection and contact resistances of the two transistors 1, 3; similarly, the voltage drop across resistor 32 should be the same as the sum of the voltage drops of the connection and the contact resistances of the transistors 2 and 4. The two other resistors 33, 43 must have a resistance which permits meeting the foregoing requirement. In the example of FIG. 1, the resistors 33, 43 have a value of 50 ohms each. The two resistors need not have the same resistance value. The N-differential stage of FIG. 1 has base connections 12, 13 which are connected to the bases of the NPN transistors 1, 2. The collector connections 10, 11 of the N-differential stage are directly connected to the respective collectors of transistors 1, 2.

Figure 2:
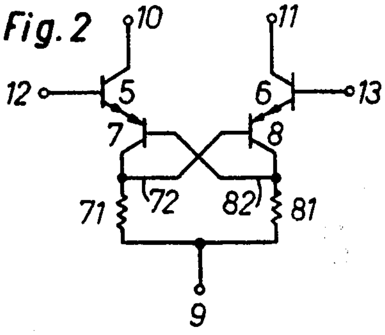
FIG. 2 is a schematic circuit diagram of an N-differential stage having two NPN transistors and two PNP transistors and two compensation resistors.

FIG. 2 shows an N-differential stage which has two NPN transistors 5, 6 and two PNP transistors 7, 8, and two compensating resistors 71, 81. FIG. 2 has a circuit which is simpler than that of FIG. 1. The resistance values of the two resistors 71, 81 in each branch must be so dimensioned that the voltage drop over the compensation resistor of one branch is equal to the sum of the voltage drops of the connecting and the contact resistances of the transistors of the respective branch. The base of transistor 8 is connected to the junction of the collector of transistor 7 and one terminal of resistor 71 by a connecting line 72; the base of transistor 7 is connected to the junction of the collector of transistor 8 and one terminal of the resistor 81 by a cross connecting line 82. The other terminals of the two resistors 71, 81 are connected together and to form the emitter terminal 9 of the overall N-differential stage. The collector terminals 10, 11 of the stage are directly connected to the collectors of the respective transistors 5, 6. The base terminals 12, 13 of the differential stage are connected directly to the bases of the transistors 5, 6.

The resistance value of the respective resistors 71, 81 is in the order of about 0.6 ohms. These resistors can be formed by discrete resistors, as shown in FIG. 2, or may be formed by suitable contact resistances, for example within the contact connection on the same semiconductor chip which includes the emitter terminal 9.

Figure 3:
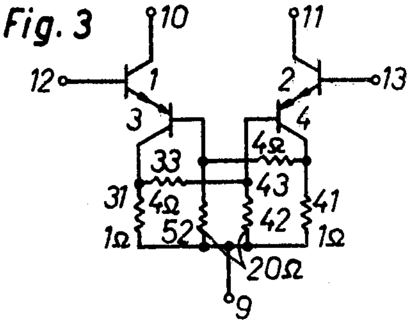
FIGS. 3 and 4 are Figures identical to FIGS. 1 and 2 showing representative resistance values for transistors of type BC327 and BC337, respectively.

FIG. 3 is identical to FIG. 1 but includes one possible set of resistance values for specific types of transistors. The transistors are BC337 and BC327 types with well-matched base-emitter-voltages.

Figure 4:
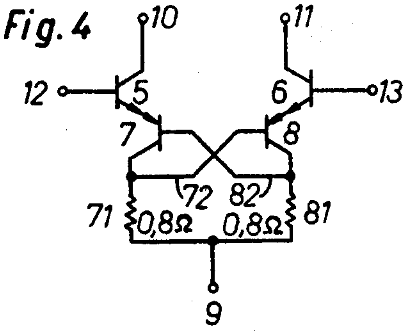

FIG. 4 is identical to FIG. 2 but includes the resistance values for the same transistor types as above. The resistor 71 has a value of about 0.8 ohms and represents the sum of the emitter-bulk-resistances of the PNP- and NPN- transistors and the sum of the base-bulk-resistances divided by the current gain of the transistors. These four terms of the sum have about the same value of about 0.2 ohms with this (large) 0.8A- transistor types. With collector currents up to 10 mA these values are nearly constant. Note that the voltage drop across a base-bulk-resistance is caused by the base current, which equals the collector current divided by the current gain. The base-bulk-resistance has a value of about 30 ohms (independent of current up to 10 mA). The current gain has a value of about 150. So the quotient has a value of about 0.2 ohms.

Figure 5:
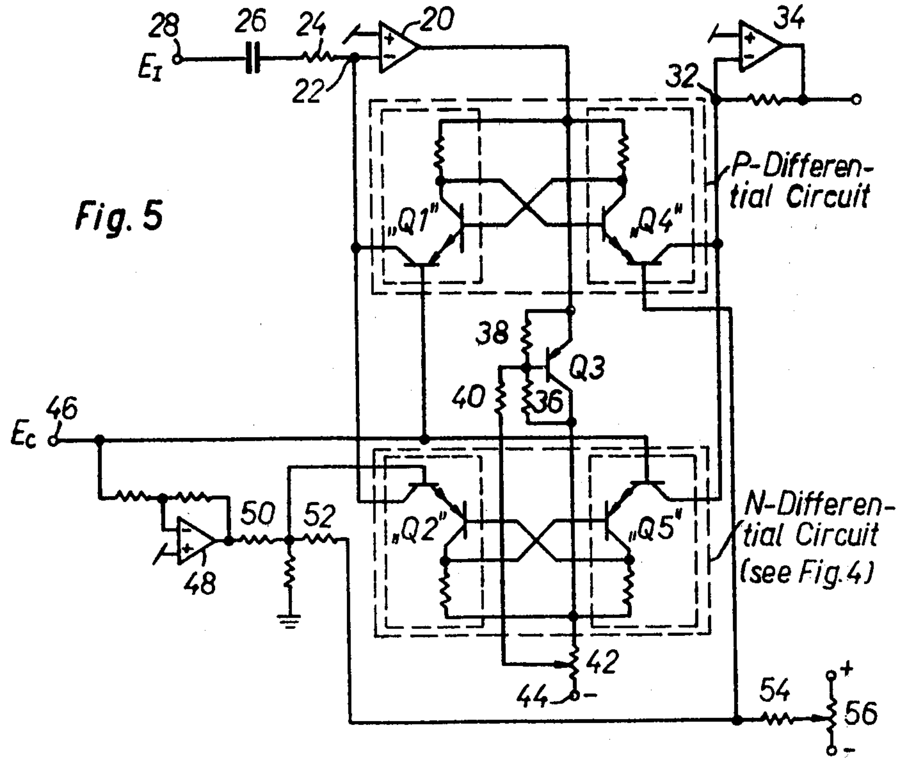
FIG. 5 shows the circuit applied to a multiplier.

FIG. 5 shows the application of the invention in the Multiplier Circuit of U.S. Pat. No. 3,714,462. For easier identification, the same topology and the same element numbering has been used.

The original circuit uses two differential circuits: a P-type differential circuit is formed with transistors Q1 and Q4; and a N-type differential circuit is formed with transistors Q2 and Q5.

FIG. 5 shows an improved Multiplier or Voltage Controlled Amplifier with two differential circuits as described in connection with FIGS. 1-4 thereof. The application of the concept of the present invention improves the distortion performance over the prior art by a factor of about fifty, or 32 dB.

Various changes and modifications may be made in the circuit, depending on the technology for which the circuit are being used and in a network into which they are to be connected.

The circuit of FIG. 1 appears more complex, but it is easier to manufacture with discrete components, since for example the higher resistance values of the resistors 33, 43 can be adjusted according to the resistance values of the transistors.

The circuit of FIG. 2 can be constructive on a single chip and the resistors 71, 81 are automatically well matched to the resistances of the transistors. This embodiment thus may be preferred when quantities justify the cost of single-chip manufacture.

The referenced book by Wong and Ott describes, in connection with functions circuits, an arrangement to compensate for errors due to voltage drops on the emitter and base bulk resistances. If the terminal collector-base voltage of a transistor connected, for example, in circuit with an operational amplifier, is essentially zero, the only collector-base voltage variation will be due to the collector resistance $r_{cs}$. The voltage drop on the collector resistance produces a change in the terminal base-emitter voltage of $$\mu_{ic} R_{cs}.$$

The total base-emitter voltage is the sum of the intrinsic base-emitter voltage, the voltage drop on the bulk resistance $R_B$ and the feedback voltage $\mu_{ic} R_{cs}$:

$$e_o = -\frac{kT}{q}\ln\left[\frac{i_i}{I_s}\left(1+\frac{qI_{cs}r_{cs}}{kT}\right)\right] - i_i(r_B + \mu r_{cs})$$

For modern silicon transistors the collector saturation current is only about 0.1 pA and the collector saturation resistance is of the order of 5 to 100 Ω, which results in the term $(1+qI_{cs}r_{cs}/kT)$ being different from 1 by less than $10^{-9}$. The effective bulk resistance $r_B$ ranges between 0.25 and 10 Ω, depending on the size of the transistor, and is generally large compared to $\mu r_{cs}$, since the feedback factor is typically $3\times10^{-4}$ and as a result $\mu r_{cs}$ is in the range of only 0.0015 to 0.03$\mu$. The conclusion is that the only significant error in the simple expression for the base-emitter voltage given in the above equation is the effect of bulk resistance in the emitter and base, provided the voltage drop on the collector saturation resistance as previously discussed is less than kT/q, which is about 26 mV at +25° C.

By applying a voltage of the proper magnitude to the base of the transistor with the logarithmic transfer function, it is possible to compensate for the error due to the voltage drop on the emitter and base bulk resistances. Such a resistor, connected between the base and ground, or reference, should have a resistance value which is kept small, since it increases the effective value of $r_B$ by the amount of the resistance value divided by $\beta$, in which $\beta$ is the common emitter-current gain of the transistor.

For an exhaustive discussion of this subject matter, reference is made to the aforementioned textbook by Wong and Ott, "Function Circuits".

I claim:

1. Transistor differential circuit having two cross-connected transistors, said transistors being characterized by having a base-voltage-difference to collector current relationship which is exponential, comprising two branches, each branch including a first transistor (1, 2; 5, 6) of a first conductivity type (NPN) and, serially connected with the collector-emitter path thereof, a second transistor (3, 4; 7, 8) of opposite conductivity type (PNP), and passive resistive network means (31, 32, 33; 41, 42, 43; 71, 81) connected to one of said transistors in each branch, said circuit means being dimensioned to compensate for voltage drops resulting from inherent or bulk resistances of the semiconductor material of the first and second transistors arising in the respective branches.

2. Circuit according to claim 1, forming a circuit component on a single semiconductor chip, wherein the connections include conductive tracks.

3. Circuit according to claim 1, wherein the network means comprises resistors.

4. Circuit according to claim 2, wherein the network means comprises resistors formed on said chip.

5. Circuit according to claim 1, wherein (FIG. 1) the first transistors (1, 2) of each branch have their emitters connected to the emitters of the second transistors of the respective branch, so that the emitters of the first and second transistors, in each branch, of the respective transistors of opposite conductivity type are connected together;

and wherein the network means comprises two low-ohm resistors (31, 32; 41, 42) connected to the bases and collectors of the second transistors of the respective branches and two further cross connecting resistors (33, 43) connected, respectively, between the collector of the second transistor (3, 4) of one branch and the base of the second transistor (4, 3) in the other branch.

6. Circuit according to claim 5, wherein said connecting resistors (32, 42) have a value of about 20 ohms, and the connecting resistors (31, 41) each have a value of about 1 ohm, and the second cross connecting resistors (33, 43) have a resistance of, each, about 4 ohms.

7. Circuit according to claim 5, wherein the connecting resistors (32, 42) connected to the respective bases of the second transistors (3, 4) of each branch provide for a voltage drop across the respective resistor (32, 42) which is equal to the sum of the voltage drops of the connecting and the contacting resistances arising in the opposite branch;

and the further cross connecting resistors (33, 43) have a value selected to insure that said voltage drop relationship is maintained.

8. Circuit according to claim 7, forming a circuit component on a semiconductor chip, said circuit being positioned on a single chip, wherein the connections include conductive tracks.

* * * * *